(12) United States Patent
Fujii et al.

(10) Patent No.: US 6,664,199 B2
(45) Date of Patent: Dec. 16, 2003

(54) COATING LIQUID FOR FORMING A SILICA GROUP COATING FILM HAVING A SMALL DIELECTRIC CONSTANT

(75) Inventors: Yasushi Fujii, Kanagawa (JP); Atsushi Matsushita, Kanagawa (JP)

(73) Assignee: Tokyo Ohka Kogyo Co., Ltd., Kanagawa (JP)

( * ) Notice: Subject to any disclaimer, the term of this patent is extended or adjusted under 35 U.S.C. 154(b) by 0 days.

(21) Appl. No.: 10/216,998

(22) Filed: Aug. 12, 2002

(65) Prior Publication Data

US 2002/0192981 A1 Dec. 19, 2002

Related U.S. Application Data

(63) Continuation of application No. 09/912,119, filed on Jul. 24, 2001.

(30) Foreign Application Priority Data

Jul. 24, 2000 (JP) ........................................ 2000-222723

(51) Int. Cl.[7] ........................ H01L 21/31; H01L 21/469
(52) U.S. Cl. ........................................ 438/778; 438/790
(58) Field of Search ................................. 438/761, 778, 438/779, 780, 784, 790, 793, 794

(56) References Cited

U.S. PATENT DOCUMENTS

| 4,868,336 A | * | 9/1989 | Presnall |
| 6,074,962 A | * | 6/2000 | Sakamoto et al. |
| 6,171,770 B1 | * | 1/2001 | Chen et al. ............... 430/531 |
| 6,329,017 B1 | * | 12/2001 | Liu et al. ................. 427/240 |

FOREIGN PATENT DOCUMENTS

| EP | 0443760 A2 | | 8/1991 |
| GB | 2344464 A | | 6/2000 |
| JP | 62232141 A | * | 10/1987 |
| JP | 62-232141 | | 10/1987 |
| JP | 63275123 A | * | 11/1988 |
| JP | 2000077410 | * | 3/2000 |

OTHER PUBLICATIONS

U.S. patent application Ser. No. 09/382,182, Tokyo Ohka Kogyo Co, not published.
Dennis W Hess and Klavs F. Jensen, Microelectronics Processing Chemical Engineering Aspects, pp. 412–415, American Chemical Society, Washington, D.C., 1989.

* cited by examiner

*Primary Examiner*—Phuc T. Dang
(74) *Attorney, Agent, or Firm*—Carrier, Blackman & Asociates, P.C.; Joseph P. Carrier; William D. Blackman (57) ABSTRACT

A coating liquid for forming a silica group coating film having a dielectric constant equal to or less than 3.2, comprises a condensation product which is obtained through hydrolysis of trialkoxysilane within an organic solvent under an acid catalysis; and at least one of polyalkylene glycol and the end alkylation product thereof. The addition amount of the at least one of polyalkylene glycol and the end alkylation product thereof is 10–500 weight % with respect to the solid component of the coating liquid, and the weight-average molecular weight of the polyalkylene glycol and the end alkylation product thereof is 100–10,000.

7 Claims, 5 Drawing Sheets

COATING LIQUID FOR FORMING A SILICA GROUP COATING FILM HAVING A SMALL DIELECTRIC CONSTANT

BACKGROUND OF THE INVENTION

1. Field of the Invention

The present invention relates to a coating liquid for forming a silica group coating film having a small dielectric constant, and more specifically to such a coating liquid and a method for processing a silica group coating film having a dielectric constant equal to or less than 3.2 in the formation of a multi-layer wiring structure, using a copper damascene method.

2. Description of Prior Art

The need for high integration of semiconductor devices is increasingly rising, and now we are running into a generation of 0.13 μm gate lengths. It is already recognized that, by using Cu as a wiring material in such instances in place of the conventional Al, the characteristics of manufactured semiconductor elements can be improved in the following aspects.

Cu is superior to Al in tolerance for EM (i.e., electromigration). Also, Cu has low resistance, and thereby it is possible to reduce signal delay due to wiring resistance. The use under high current density can be achieved, that is, an allowable current density can be improved by three (3) times or more, and thereby the width of wiring can be made fine.

However, since it is difficult to control the etching rate of Cu compared to Al, a copper damascene method attracts attention as a method for realizing multi-layer wiring of Cu without any etching process. A lot of proposals have been made (for example, Japanese unexamined patent application publication No. 2000-174023 and Japanese unexamined patent application publication No. 2000-174121).

Figure 5:
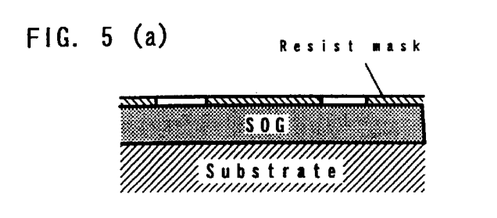
FIGS. 5(a)–(h) show the steps of forming a multi-layer wiring structure using a copper damascene.

Explanation of the copper damascene method will now be given with reference to FIG. 5.

First, as shown in FIG. 5(a), an intermediate insulating film, which is comprised of $SiO_2$ through a CVD method or SOG and has a low dielectric constant, is formed on a substrate, and a resist mask having a pattern is provided thereon. By etching, as shown in FIG. 5(b), wiring gutters are formed. Next, as shown in FIG. 5(c), the wiring gutters are lined with barrier metal, and as shown in FIG. 5(d), Cu is embedded into the gutters by means of electrolysis plating so as to form a lower layer wiring. After polishing the barrier metal and Cu by chemical polishing, as shown in FIG. 5(e), another intermediate insulating film is formed thereon. In the same manner, by selectively etching the intermediate insulating film through a resist mask having a pattern, as shown in FIG. 5(f), via-holes (or contact holes) and trench holes (i.e., gutters for an upper layer wiring) are formed (dual damascene). As shown in FIG. 5(g), the via-holes and the gutters for an upper layer wiring are lined with barrier metal, as shown in FIG. 5(h), Cu is embedded into the via-holes and the gutters for an upper layer wiring by means of electrolysis plating or the like, and thereby an upper layer wiring is formed.

In the above-mentioned explanation, copper is used for forming wiring in a damascene method. However, a damascene method can be conducted with aluminum. The present invention can be applied to a damascene method using various conductive metal as well as the copper damascene method.

When multi-layer wiring is formed by a damascene method, it is required that an aspect ratio (i.e., height/width) of via-holes should be increased for micros. However, if $SiO_2$ through a CVD method is used for an intermediate insulating film, the aspect ratio will be at most 2. Also, the dielectric constant of $SiO_2$ is relatively high ($\in$=4.1), which is not satisfactory.

Therefore, the use of organic or inorganic SOG having a lower dielectric constant has been examined. Further, it is desired to make the dielectric constant of organic or inorganic SOG lower.

It is recognized that the dielectric constant of an intermediate insulating film can be decreased by making the intermediate insulating film porous. However, the lower dielectric constant of the intermediate insulating film decreases the density of the film. As a result of this, damage or crack occurs in the intermediate insulating film when a plasma ashing process of a resist film is conducted as a subsequent process, and thereby it is difficult to obtain a reliable semiconductor element.

It is supposed that the reason of the damage in the intermediate insulating film is because Si—R group (R means lower alkyl group or hydrogen atom) is decomposed (R group is separated) by the ashing process and Si—OH bond is produced.

For example, in the case of organic SOG, Si—CH3 bond (CH3 is an example) is broken to be Si—OH. In the case of inorganic SOG, Si—H bond is broken to be Si—OH.

SUMMARY OF THE INVENTION

According to the present invention, to solve the problems as mentioned above, there is provided a method for processing a coating film comprising the steps of forming a silica group coating film having a dielectric constant equal to or less than 3.2 (preferably equal to or less than 2.7) on a substrate, etching the silica group coating film through a resist pattern, processing the silica group coating film, to which an etching process has been conducted, with plasma induced from inactive gas such as helium gas or the like, and removing the resist pattern by an ashing process.

It is possible to prevent damage in an ashing process by conducting a pre-ashing process with plasma induced from inactive gas such as helium gas or the like. It is supposed that the reason is because plasma induced from inactive gas such as helium gas or the like attacks the coating film having Si—H group and Si—H bond in the surface layer is changed into Si—O—Si bond.

The dielectric constant equal to or less than 3.2 is required for an intermediate insulating film used in a damascene method. A lower dielectric constant is preferred. The silica group coating film is not limited to a particular one as far as it has such a dielectric constant. The silica group coating film having such a dielectric constant can be achieved by forming with coating liquid as described below.

A coating liquid for forming a silica group coating film having a dielectric constant equal to or less than 3.2, comprises: a condensation product which is obtained through hydrolysis of trialkoxysilane within an organic solvent under an acid catalysis; and at least one of polyalkylene glycol and the end alkylation product thereof.

In particular, it is preferable to obtain the coating liquid by dissolving trialkoxysilane having a concentration of 1–5 weight % in a case of converting into $SiO_2$ into alkylene glycol dialkyl ether, adding water of 2.5–3.0 mols per 1 mol of the trialkoxysilane to this solution and adjusting the content of alcohol produced through a reaction in a reacting mixture to be less than or equal to 15 weight % after conducting a hydrolytic condensation under an acid catalyst.

An intermediate insulating film having a ladder structure can be obtained by using trialkoxysilane having a concentration of 1–5 weight % in a case of converting into $SiO_2$. Independent of being organic or inorganic, by making a ladder structure, a film which is dense and has a low dielectric constant can preferably be formed as mentioned above.

As the above-mentioned trialkoxysilane, it is possible to list trimethoxysilane, triethoxysilane, tripropoxysilane, tributoxysilane, diethoxy monomethoxysilane, monomethoxy dipropoxysilane, dibutoxy monomethoxysilane, ethoxy methoxy propoxysilane, monoethoxy dimethoxysilane, monoethoxy dipropoxysilane, butoxy ethoxy propoxysilane, dimethoxy monopropoxysilane, diethoxy monopropoxysilane, and monobutoxy dimethoxysilane. Among these, compounds preferable in practice are: trimethoxysilane, triethoxysilane, tripropoxysilane, and tributoxysilane. In particular, trimethoxysilane and triethoxysilane are preferable.

As the solvent, in order to increase the stability of preservation, it is necessary to use alkylene glycol dialkyl ether. By using this, it is possible to control a decomposition reaction of H—Si group in trialkoxysilane or a substitution reaction of hydroxy group for alkoxy group in silanol produced as an intermediate product, which occurs in the conventional art using lower alcohol as a solvent, and thereby it is possible to prevent the gelation.

As the alkylene glycol dialkyl ether, it is possible to list a dialkylether type of alkylene glycol such as ethylene glycol dimethylether, ethylene glycol diethylether, ethylene glycol dipropylether, ethylene glycol dibutylether, diethylene glycol dimethylether, diethylene glycol diethylether, diethylene glycol dipropylether, diethylene glycol dibutylether, propylene glycol dimethylether, propylene glycol diethylether, propylene glycol dipropylether, and propylene glycol dibutylether. Among these, a preferable compound is a dialkylether type, in particular, a dimethylether type of ethylene glycol or propylene glycol. These organic solvents may be used alone or by combining two or more kinds thereof. Also, these organic solvents are used at a ratio of 10–30 times mol with respect to 1 mol of alkoxysilane.

It is necessary that water used for hydrolysis of trialkoxysilane be within a range of 2.5–3.0 mols with respect to 1 mol of trialkoxysilane, preferably within a range of 2.8–3.0 mols, so as to increase the degree of hydrolysis. If it is too small compared to this range, although the stability in preservation is increased, the degree of hydrolysis is deteriorated, the content of organic group in the hydrolysis product is increased, and thereby gas is generated at the time of forming a coating film. If it is too much compared to this range, the stability in preservation is deteriorated.

Even if at least one kind of alkylene glycol dialkyl ether is used as a solvent rather than alcohol, since alcohol corresponding to alkoxy group is inevitably generated in the course of hydrolysis of alkoxysilane, it is necessary to remove the generated alcohol from the reaction system. Specifically, it is necessary to remove the alcohol to be less than or equal to 15 weight %, preferably to be less than or equal to 8 weight %, in the coating liquid. If the alcohol exceeds 15 weight %, H—Si group and the generated alcohol react each other, RO—Si group is generated and the crack limit is deteriorated. In addition, gas is generated at the time of forming a coating film and the above-mentioned trouble is caused.

As a method for removing the alcohol, it is preferable to conduct distillation under reduced pressure for 2–6 hours in a temperature of 20–50° C. in a degree of vacuum of 30–300 mmHg, preferably 50–200 mmHg. The coating liquid obtained in this manner has characteristics of showing the increase in the weight of the film-forming component after the removal of the solvent in a thermogravimetric analysis, and not having its peak at 3,000 $cm^{-1}$ in the infrared absorption spectrum. The conventional coating liquid, which is described in Japanese unexamined patent application publication No. Hei 4-216827 (1992), shows the decrease in the weight in a thermogravimetric analysis, and has its peak in the vicinity of 3,000 $cm^{-1}$ in the infrared absorption spectrum, which indicates that alkoxy group still exists therein.

One kind selected from polyalkylene glycol and the end alkylation product thereof may be included in the coating liquid. As a result of this, an intermediate insulating film can be made porous and the dielectric constant can be decreased.

As the polyalkylene glycol, it is possible to list lower polyalkylene glycol such as polyethylene glycol, polypropylene glycol or the like. The end alkylation product means lower polyalkylene glycol in which hydroxy group in one or both end(s) of the lower polyalkylene glycol is made to be alkoxyl with lower alkyl group such as methyl group, ethyl group, propyl group, or the like.

The addition amount of the one kind selected from polyalkylene glycol and the end alkylation product is 10–500 weight %, preferably 50–200 weight %, with respect to the solid component of the coating liquid.

The weight-average molecular weight of the polyalkylene glycol and the end alkylation product is 100–10,000, preferably 200–5,000. This range can easily make the dielectric constant lower without any damage to solubility in the coating liquid.

According to the present invention, there is also provided a method for manufacturing a semiconductor element comprising the following steps of:

(1) forming a silica group coating film having a dielectric constant equal to or less than 3.2 (preferably equal to or less than 2.7) on a substrate;

(2) providing a resist pattern on the silica group coating film;

(3) etching the silica group coating film using the resist pattern as a mask;

(4) processing the silica group coating film with plasma induced from inactive gas such as helium gas or the like; and (5) conducting an ashing process to the resist pattern with plasma induced from oxygen gas.

In the above-mentioned step of forming a silica group coating film, for example, coating liquid is applied onto a substrate such as a semiconductor substrate, a glass substrate, a metal plate, a ceramic substrate, or the like by means of a spinner method, a roll coater method, an immersion coating method, a spray method, a screen printing method, a brush painting method, or the like. It is dried to evaporate the solvent therein and a coating film is formed.

In the steps of (2), (3) and (5), the conventional means can be used.

In the step of processing the silica group coating film with plasma induced from inactive gas such as helium gas or the like, a plasma processing apparatus for generating plasma gas from the above-mentioned gas (for example, TCA-7822 manufactured by Tokyo Ohka Kogyo Co., Ltd.) is used. The plasma processing is conducted under pressure of 10–600 mTorr, preferably 100–500 mTorr, and for 30–300 seconds, preferably 30–120 seconds.

Another plasma processing apparatus may be used as well as TCA-7822. Also, as the inactive gas, neon, argon or the like may be used as well as helium.

DETAILED DESCRIPTION OF PREFERRED EMBODIMENTS

Hereinafter, embodiments according to the present invention will be fully explained with reference to the attached drawings.

Preparation of Coating Liquid

Coating Liquid 1

Triethoxysilane of 73.9 g (0.45 mol) having a concentration of 3 weight % in a case of converting into $SiO_2$ is dissolved and stirred into ethylene glycol dimethylether of 799.0 g (8.87 mol), a mixture of pure water of 24.2 g (1.34 mol) and nitric acid of 5 ppm is slowly stirred and dropped thereinto, and it is stirred for about 3 hours. Thereafter, it is left still for 6 days in a room temperature, so as to obtain a solution.

Reduced-pressure distillation is conducted to this solution at 120–140 mmHg and 40° C. for 1 hour, and coating liquid is prepared. In the coating liquid, the concentration of solid component is 8 weight % and the concentration of ethanol is 3 weight %. This solution is coating liquid 1.

The dielectric constant of a coating film formed with coating liquid 1 is 3.1.

Coating Liquid 2

A both-end methylation product of polyethylene glycol having weight-average molecular weight of 200 is added to coating liquid 1 at a ratio of 100 weight % to the solid component of coating liquid 1, sufficiently stirred and thereby a uniform solution is obtained. This solution is coating liquid 2.

The dielectric constant of a coating film formed with coating liquid 2 is 2.6.

Embodiment 1: Coating Liquid 1 and He Processing

A substrate is rotated and coated with coating liquid 1, and thereby a coating film having a thickness of 4500 Å is formed on the substrate. The refractive index of the coating film is 1.40.

A resist pattern is formed on the coating film. An etching process is conducted using the resist pattern as a mask and wiring gutters are formed.

A plasma processing is conducted with helium gas having a concentration of 700 sccm at the pressure of 500 mTorr for 30 seconds.

An ashing process is conducted with oxygen plasma using a batch-type plasma ashing apparatus (OPM-EM 1000 manufactured by Tokyo Ohka Kogyo Co., Ltd.) at the pressure of 1000 mTorr for 300 seconds.

Figure 1:
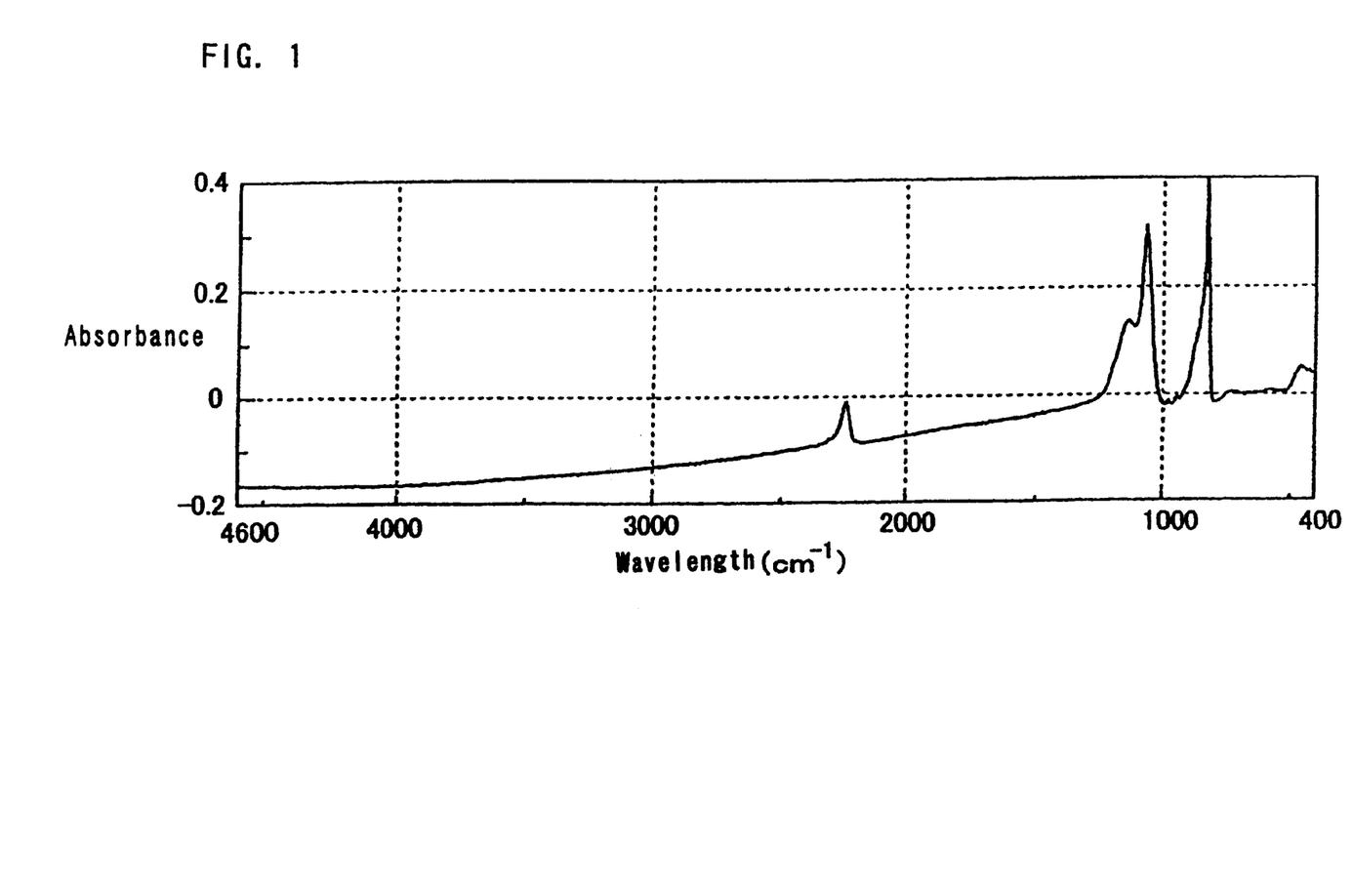
FIG. 1 is a graph showing the infrared absorption spectrum of a coating film formed in embodiment 1 of the present invention after the ashing process of the resist on the coating film.

FIG. 1 shows the infrared absorption spectrum of the coating film after the ashing process. The peak showing Si—R (R is hydrogen atom) is apparent in FIG. 1, which indicates that there is no damage to the coating film.

Embodiment 2: Coating Liquid 2 and He Processing

The same processing as in embodiment 1 is conducted, except that coating liquid 2 is used instead of coating liquid 1.

Figure 2:
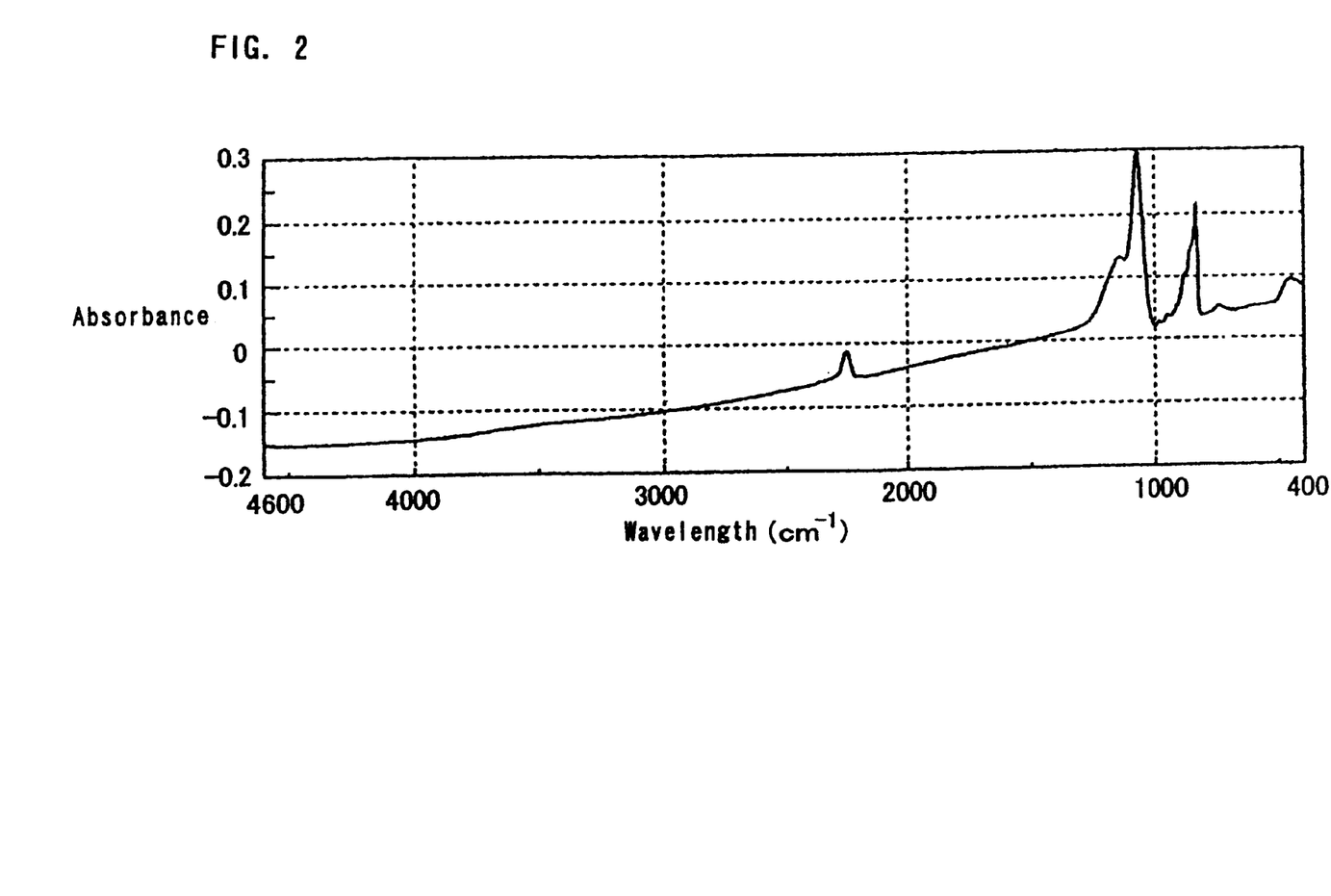
FIG. 2 is a graph showing the infrared absorption spectrum of a coating film formed in embodiment 2 of the present invention after the ashing process of the resist on the coating film.

FIG. 2 shows the infrared absorption spectrum of the coating film after the ashing process. The peak showing Si—R (R is hydrogen atom) is apparent in FIG. 2, which indicates that there is no damage to the coating film.

Comparative Example 1

Coating Liquid 1 and No He Processing

The same processing as in embodiment 1 is conducted, except that a plasma processing with helium gas is not conducted.

Figure 3:
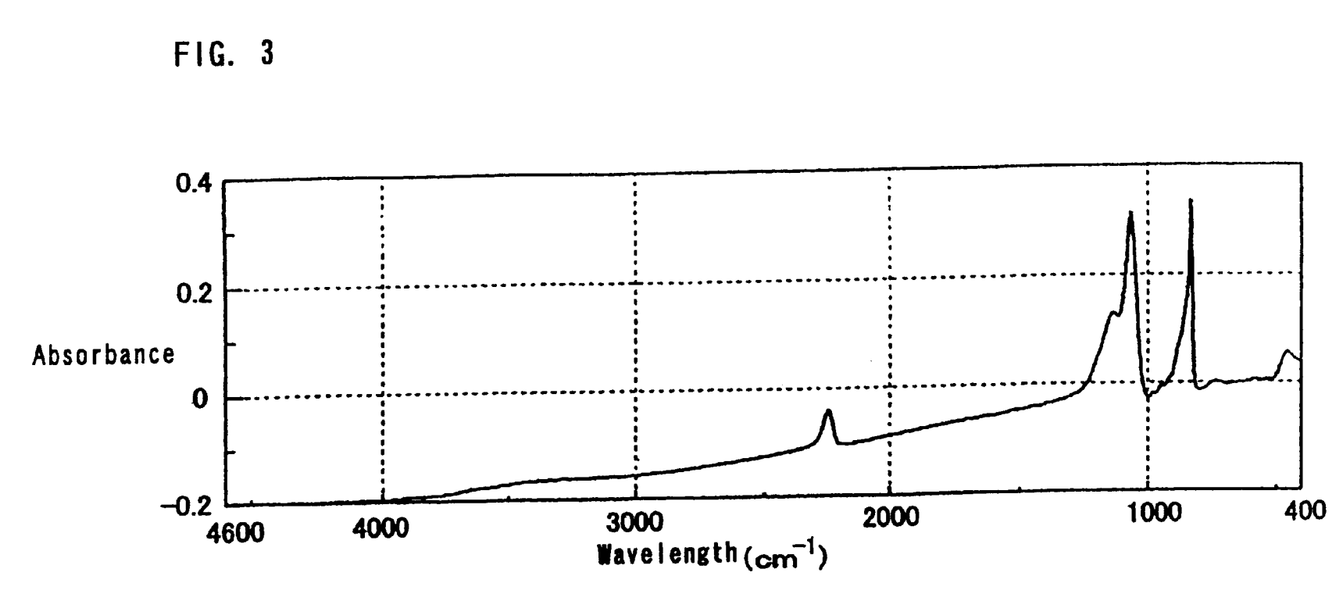
FIG. 3 is a graph showing the infrared absorption spectrum of a coating film formed in comparative example 1 after the ashing process of the resist on the coating film.

FIG. 3 shows the infrared absorption spectrum of the coating film after the ashing process. The peak showing Si—R (R is hydrogen atom) slightly collapses in FIG. 3, which indicates that the coating film is damaged.

Comparative Example 2

Coating Liquid 2 and No He Processing

The same processing as in embodiment 2 is conducted, except that a plasma processing with helium gas is not conducted.

Figure 4:
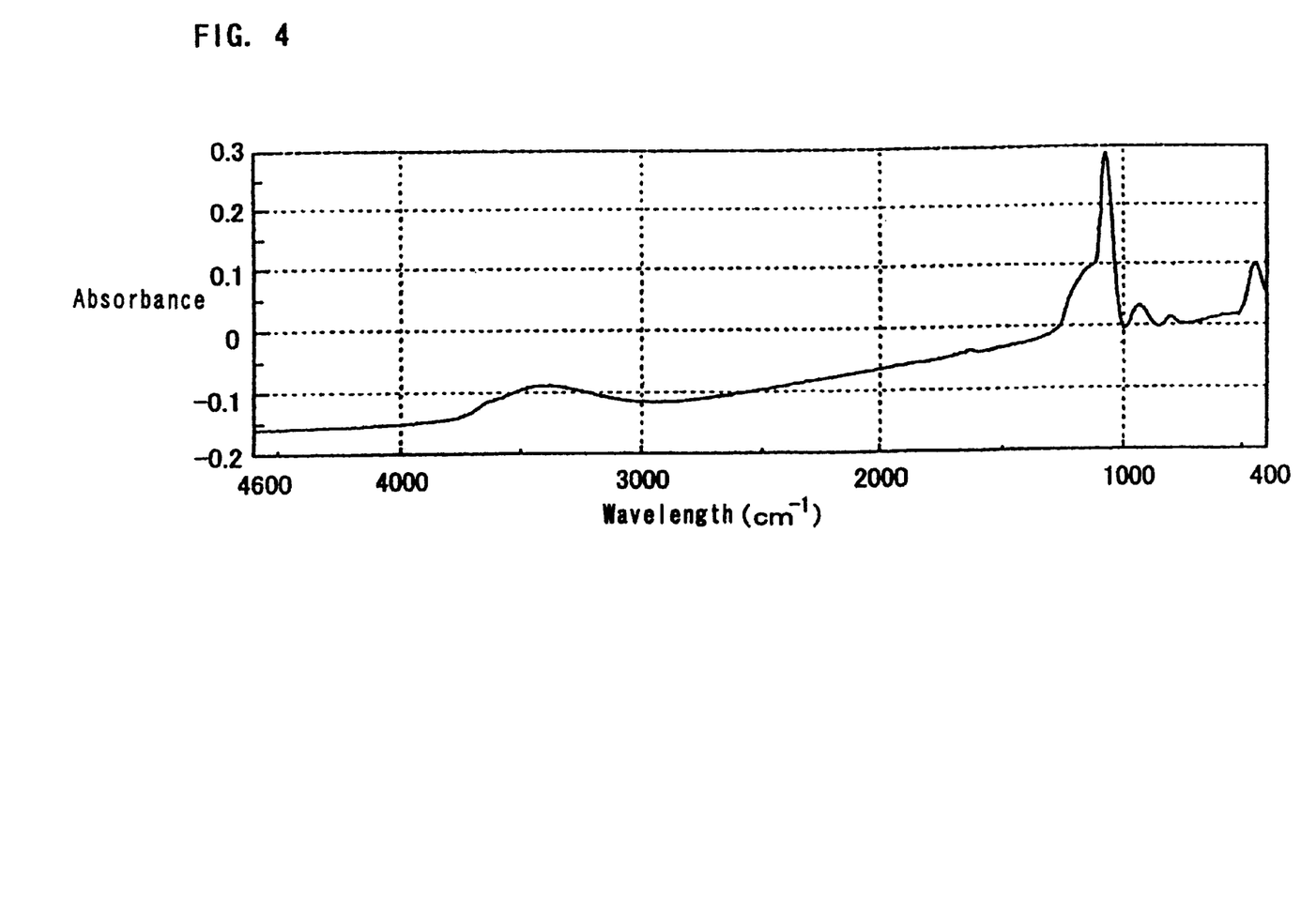
FIG. 4 is a graph showing the infrared absorption spectrum of a coating film formed in comparative example 2 after the ashing process of the resist on the coating film.

FIG. 4 shows the infrared absorption spectrum of the coating film after the ashing process. The peak showing Si—R (R is hydrogen atom) collapses in FIG. 4, which indicates that the coating film is damaged.

As is fully described in the above, according to the present invention, since an etching process is conducted to a silica group coating film having a dielectric constant equal to or less than 3.2 formed on a substrate through a resist pattern, and thereafter, a plasma processing is conducted to the silica group coating film with plasma induced from inactive gas such as helium gas or the like, the silica group coating film is not damaged when an ashing process is conducted to the resist pattern as a subsequent process, and the low dielectric constant can be maintained.

Therefore, if the present invention is applied to the damascene method, it is possible to obtain a reliable semiconductor element.

Also, according to the present invention, since one kind selected from polyalkylene glycol and the end alkylation product thereof is included in a coating liquid, the dielectric constant of the silica group coating film formed with the coating liquid can be lowered, which is advantageous to micros.

Although there have been described what are the present embodiments of the invention, it will be understood by persons skilled in the art that variations and modifications may be made thereto without departing from the jist, spirit or essence of the invention as set forth in the appended claims.

What is claimed is:

1. A coating liquid for forming a silica group coating film having a dielectric constant equal to or less than 3.2, comprising:

a condensation product which is obtained through hydrolysis of trialkoxysilane within an organic solvent under an acid catalysis; and at least one of polyalkylene glycol and the end alkylation product thereof.

2. A coating liquid for forming a silica group coating film having a dielectric constant equal to or less than 3.2 as defined in claim 1, wherein the addition amount of said at least one of polyalkylene glycol and the end alkylation product thereof is 10–500 weight % with respect to the solid component of the coating liquid.

3. A coating liquid for forming a silica group coating film having a dielectric constant equal to or less than 3.2 as defined in claim 1, wherein the weight-average molecular weight of the polyalkylene glycol and the end alkylation product thereof is 100–10,000.

4. A coating liquid for forming a silica group coating film having a dielectric constant equal to or less than 3.2 as defined in claim 1, wherein the weight-average molecular weight of the polyalkylene glycol and the end alkylation product thereof is 200–5,000.

5. A coating liquid for forming a silica group coating film having a dielectric constant equal to or less than 3.2 as defined in claim 1, wherein said organic solvent is alkylene glycol dialkyl ether.

6. A coating liquid for forming a silica group coating film having a dielectric constant equal to or less than 3.2 as defined in claim 1, wherein the content of alcohol in the coating liquid is less than or equal to 15 weight %.

7. A coating liquid for forming a silica group coating film having a dielectric constant equal to or less than 3.2 as defined in claim 1, wherein the formed film has a ladder structure.

* * * * *

UNITED STATES PATENT AND TRADEMARK OFFICE
CERTIFICATE OF CORRECTION

PATENT NO. : 6,664,199 B2  Page 1 of 1
APPLICATION NO. : 10/216998
DATED : December 16, 2003
INVENTOR(S) : Fujii et al.

It is certified that error appears in the above-identified patent and that said Letters Patent is hereby corrected as shown below:

Title page:
Under section (56) "References Cited", further under "OTHER PUBLICATIONS", change
"Dennis W Hess and Klavs F. Jensen, Microelectronics Processing Chemical Engineering Aspects, pp. 412-415, American Chemical Society, Washington, D.C., 1989."
to --Dennis W. Hess and Klavs F. Jensen, editors. *Microelectronics Processing: Chemical Engineering Aspects*. Washington, D.C.: American Chemical Society, 1989, pp. 412-415.--.

Column 2:
Line 6, change "($\in$=4.1)" to --($\varepsilon$ =4.1)--.
Line 65, change "converting into $SiO_2$ into alkylene" to --converting $SiO_2$ into alkylene--.

Column 4:
Line 22, change "glycol or the like" to --glycol, or the like--.

Column 5:
Line 5, change "argon or the" to --argon, or the--.

Signed and Sealed this

Ninth Day of June, 2009

JOHN DOLL
*Acting Director of the United States Patent and Trademark Office*